(12) United States Patent
Zhou et al.

(10) Patent No.: US 7,553,678 B2
(45) Date of Patent: Jun. 30, 2009

(54) METHOD FOR DETECTING SEMICONDUCTOR MANUFACTURING CONDITIONS

(75) Inventors: Wen-Zhan Zhou, Singapore (SG); Jin Yu, Singapore (SG); Kai-Hung Alex See, Singapore (SG)

(73) Assignee: United Microelectronics Corp., Hsin-Chu (TW)

( * ) Notice: Subject to any disclaimer, the term of this patent is extended or adjusted under 35 U.S.C. 154(b) by 650 days.

(21) Appl. No.: 11/308,343

(22) Filed: Mar. 17, 2006

(65) Prior Publication Data

US 2007/0220458 A1  Sep. 20, 2007

(51) Int. Cl.
  *G01R 31/26* (2006.01)
(52) U.S. Cl. ............... 438/14; 438/5; 438/7; 438/16; 257/E21.522; 430/5; 430/30; 382/144; 382/145; 382/147
(58) Field of Classification Search ............ 438/5, 438/7, 8, 9, 14, 16; 257/E21.522; 430/5, 430/30, 311; 382/144, 145, 147, 151
  See application file for complete search history.

(56) References Cited

U.S. PATENT DOCUMENTS

| | | | |
|---|---|---|---|
| 6,563,564 B2 | 5/2003 | de Mol et al. | |
| 7,008,731 B2 | 3/2006 | Nojima et al. | |
| 7,427,457 B1 * | 9/2008 | Plat et al. | 430/5 |
| 2002/0102468 A1 * | 8/2002 | Tzu et al. | 430/5 |
| 2005/0037272 A1 | 2/2005 | Tanaka | |

FOREIGN PATENT DOCUMENTS

| | | |
|---|---|---|
| TW | 500987 | 9/2002 |
| TW | 571176 | 1/2004 |
| TW | 200401172 | 1/2004 |

* cited by examiner

*Primary Examiner*—N Drew Richards
*Assistant Examiner*—Joannie A Garcia
(74) *Attorney, Agent, or Firm*—Winston Hsu

(57) ABSTRACT

A method for detecting semiconductor-manufacturing conditions includes providing a photomask with a plurality of pattern areas each having a plurality of test lines with different pitches, exposing a plurality of wafer with the photomask in different manufacturing conditions, measuring the critical dimensions of the plurality of pattern areas, generating a library of relationships between the pitches and the critical dimension of the pattern areas, exposing a test wafer in an unknown manufacturing condition, finding out a relationships between the pitches and the critical dimension of the pattern areas of the test wafer, searching for a most similar relationship in the library, and detecting a set of manufacturing parameters used to expose the test wafer.

18 Claims, 11 Drawing Sheets

METHOD FOR DETECTING SEMICONDUCTOR MANUFACTURING CONDITIONS

BACKGROUND OF THE INVENTION

1. Field of the Invention

The present invention is related to a method for detecting a condition of a semiconductor wafer, and more particularly, to a method for detecting the condition by using scatterometry critical dimension metrology.

2. Description of the Prior Art

With the advancements of wafer manufacturing processing, advanced lithography makes it possible to mass manufacture semiconductor elements that have line widths of less than 100 nano-meters. However, while the scale of semiconductor is reduced, the critical dimensions (CD) of channel length, junction depth, and gate thickness of a field effect transistor (FET), for example, are reduced, as well. These critical dimensions should be accurately controlled because a little change in the critical dimensions may cause a lot of change in the characteristics of the semiconductor element. Therefore, the measurements of critical dimensions with advanced lithography will become more and more important in the future. Rapid and repeatable measurements will be used to detect the characteristics of semiconductor products on a production line. The accuracy of the measurements influences the yield and the reliability of the semiconductor products.

Some favorable metrologies for semiconductor process include advanced bright-field microscopy, scanning electron microscopy (SEM), scatterometry, and atomic force microscopy (AFM). Among them, the scatterometry metrology provides much progress in critical dimension measurement and profile analysis. Scatterometry can provide more information than other metrologies, such as pitch, sidewall angles, thickness, and the thickness of the underlying thin film. Therefore, the scatterometry CD metrology has been widely used in the photolithography process to provide the critical dimension measurement and profile analysis. The advantages of using scatterometry in the photolithography process lie in its non-destructive measurement, the ability to measure the critical dimension as small as 40 nm, and installation without expensive equipment.

The major principle of scatterometry is that the intensity of incident light of the periodic gratings varies with the incident angle or with the wavelength of the incident light and the relationship between reflectance and angle/wavelength can be recorded as different signatures. Scatterometry can be divided into forward metrology and reverse metrology. Forward metrology is to measure the spectra of the laser beam reflected by the periodic grating. Reverse metrology is to compare the measured spectra with the theoretical spectra model to provide the structure information of the grating. The reverse metrology can be further divided into library matching method and direct regression method. The library matching method compares the measured data with the data in a library to find the closest grating structure. The direct regression method compares the measured data with a theoretical model, and modifies the parameter to gradually reduce the difference between measured and theoretical data.

In the prior art, only the impact on the critical dimensions from limited process parameters is analyzed, such as the relationship between the exposure energy and the critical dimension. Most of the other process parameters, such as post-bake temperature and illumination conditions, are seldom discussed and it is difficult to know their impact on the critical dimension.

SUMMARY OF THE INVENTION

It is therefore an objective of the invention to provide a method for detecting the impact of a plurality of semiconductor manufacturing parameters.

A method for detecting a condition for manufacturing a semiconductor wafer comprises providing a photomask having a plurality of pattern areas, each of the pattern areas having a plurality test lines, pitches between the test lines of different pattern areas being different; exposing a plurality of wafers via the photomask with different sets of process parameters so as to form pattern areas with test lines of different pitches on each of the wafers; measuring a critical dimension of each of the pattern areas of each of the wafers; establishing a relationship library between the pitches of the pattern areas of each of the wafers and the measured critical dimensions of the pattern areas of the wafer; exposing a test wafer via the photomask so as to form pattern areas with test lines of different pitches on the test wafer; measuring a critical dimension of each of pattern areas of the test wafer; establishing a relationship between the pitches of the pattern areas of the test wafer and the measured critical dimensions of the pattern areas of the test wafer; finding a relationship from the relationships library which is most similar to the relationship of the test wafer; and detecting a set of process parameters used to expose the test wafer according to the relationship found in the relationships library.

These and other objectives of the present invention will no doubt become obvious to those of ordinary skill in the art after reading the following detailed description of the preferred embodiment that is illustrated in the various figures and drawings.

DETAILED DESCRIPTION

As progress continues in the semiconductor industry, the reduction in the size of semiconductor devices makes proximity effects more significant. Proximity effects can be related to certain photolithographic process parameters, such as illumination setting, defocus, post exposure bake conditions, properties of photoresist, and so forth. These process factors have different impacts on proximity behavior. The present invention proposes methods to analyze the respective impact of these photolithographic process parameters on the proximity behavior and therefore to detect and modify the problem in semiconductor manufacturing.

Figure 1:
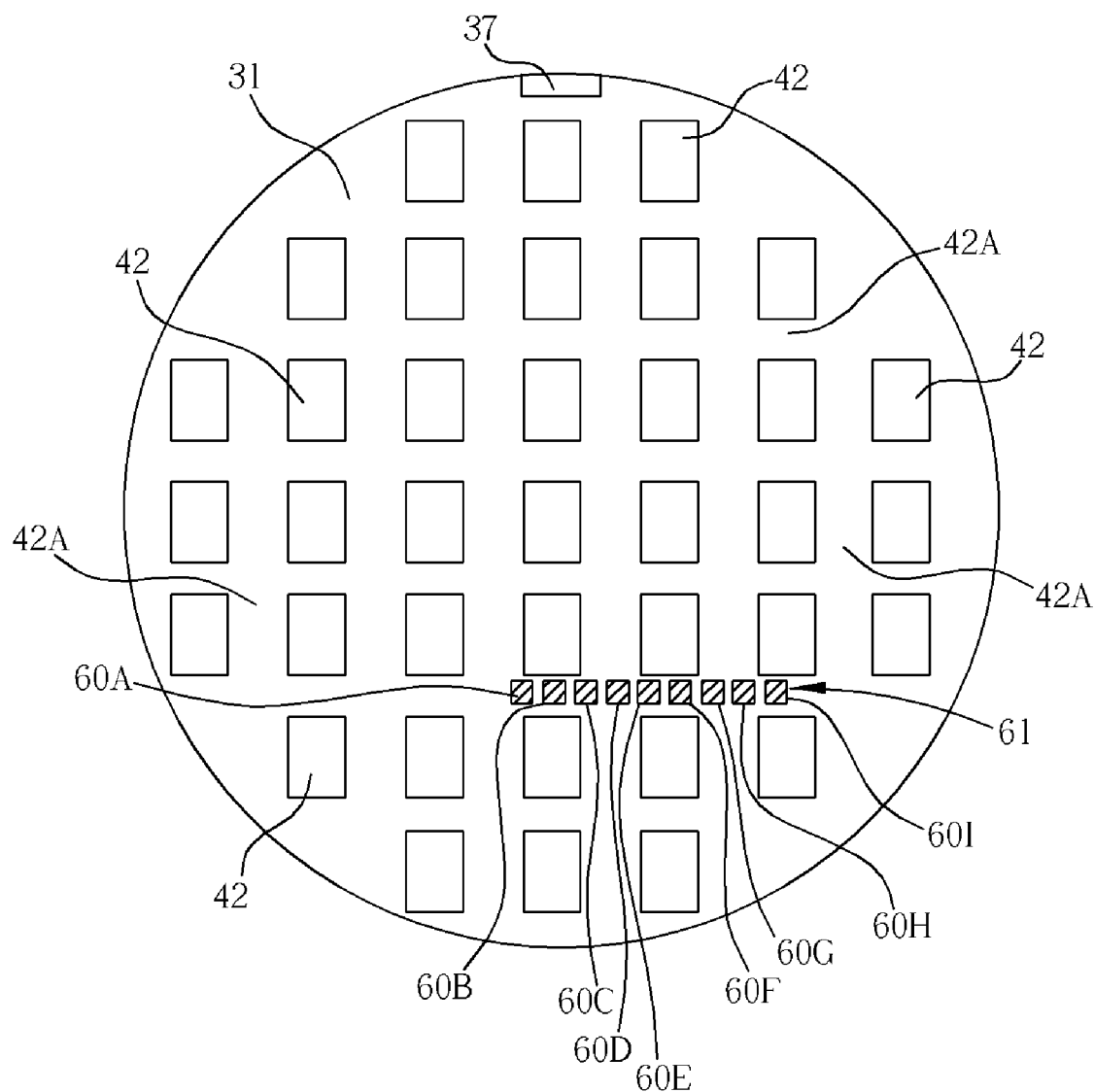
FIG. 1 shows a wafer used in critical dimension metrology of the present invention.
Figure 2:
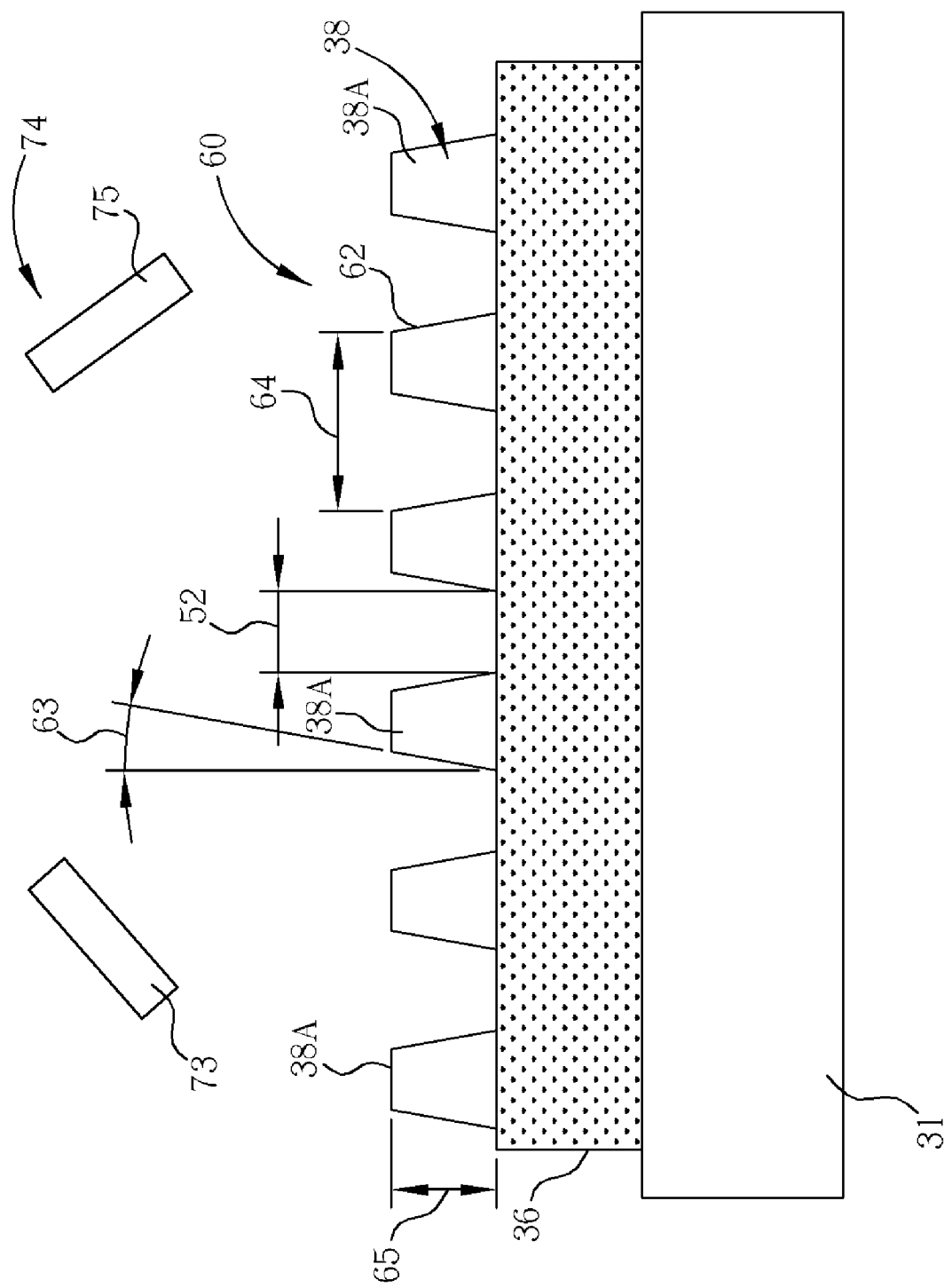
FIG. 2 shows a setting of the scatterometry critical dimension metrology of the present invention.
Figure 3:
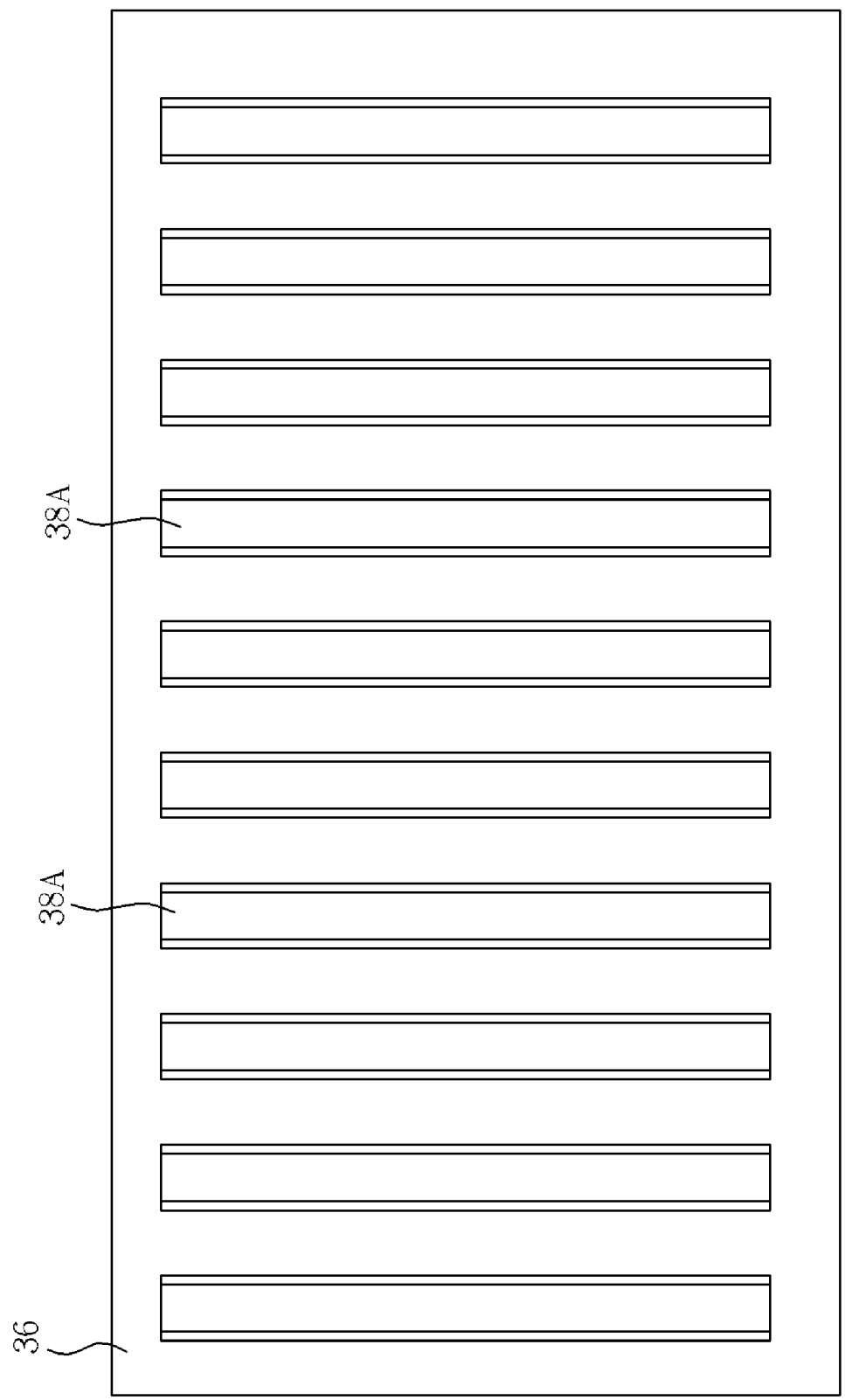
FIG. 3 shows a grating structure on the wafer for critical dimension measurement of the present invention.

Please refer to FIG. 1. FIG. 1 shows a wafer 31 for sactterometric critical dimension measurement of the present invention. A plurality of production dies 42 are formed above the wafer 31 and the production dies 42 are separated from each other by scribe lines 42A. After the fabrication processes are completed, the wafer 31 will be cut along the scribe lines 42A to separate the production dies 42. There is an alignment notch 37 that is used to provide relatively rough alignment of the wafer 31 in the manufacturing process. An illustrative array 61 of a plurality of grating structures 60A-60I is formed above the wafer 31. The size, shape, number, location and orientation of the grating structures 60A-60I may be varied as a matter of design choice and not limited to what is shown in FIG. 1. Please refer to FIG. 2 and FIG. 3. FIG. 2 shows a illustrative block diagram of a sactterometric critical dimension measurement of the present invention. An illustrative scatterometry tool 74 comprises a representative light source 73 and a detector 75. The grating structure 60A-60I in FIG. 1 may be referred to individually and/or collectively by the grating structure 60 in FIG. 2. The layer of photoresist is formed above a layer of thin film 36. The photoresist features 38A comprising the grating structure 60 have a thickness 65 and sidewalls 62 disposed at a sidewall angle 63. The photoresist features 38A are separated by a space 52 that defines the critical dimension of the illustrative grating structure 60. The thickness 65, the sidewall angle 63, the pitch 64 of the photoresist features 38A, and the spacing 52 between the photoresist features 38A may be varied as a matter of design choice. The principle of scatterometry is well-known to those skilled in this field and will not be explained further. The scatterometry critical dimension measurement shows very low measurement noise level whose 3-sigma noise level is as low as 1-2 nm, and therefore it is very suitable for the present invention. However, any critical dimension measurement method which can give an equivalent noise level as the one in the scatterometry critical dimension measurement is also a good substitute in the present invention.

Figure 4:
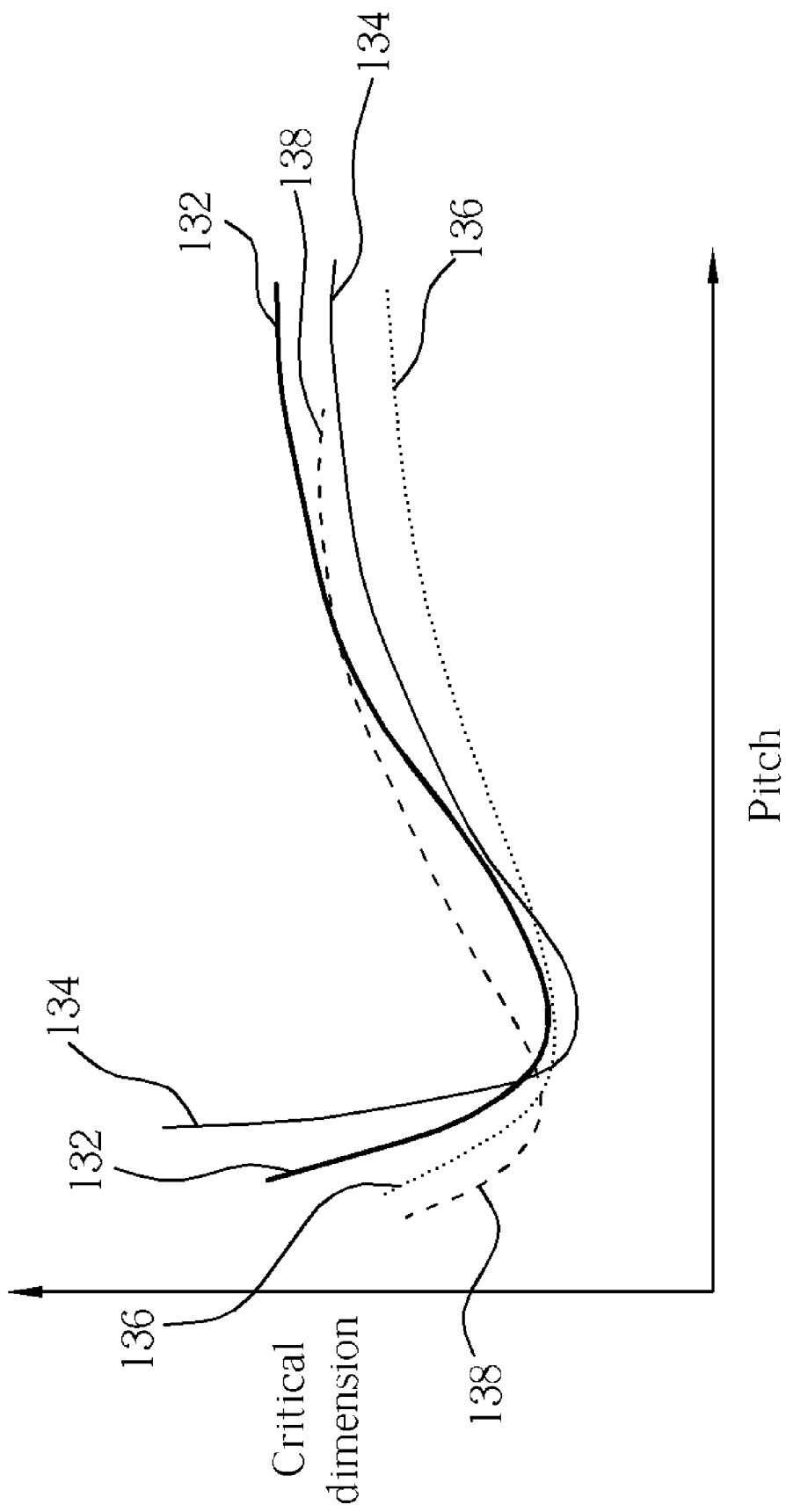
FIG. 4 shows proximity profile curves measured according to the metrology in FIG. 2.
Figure 5:
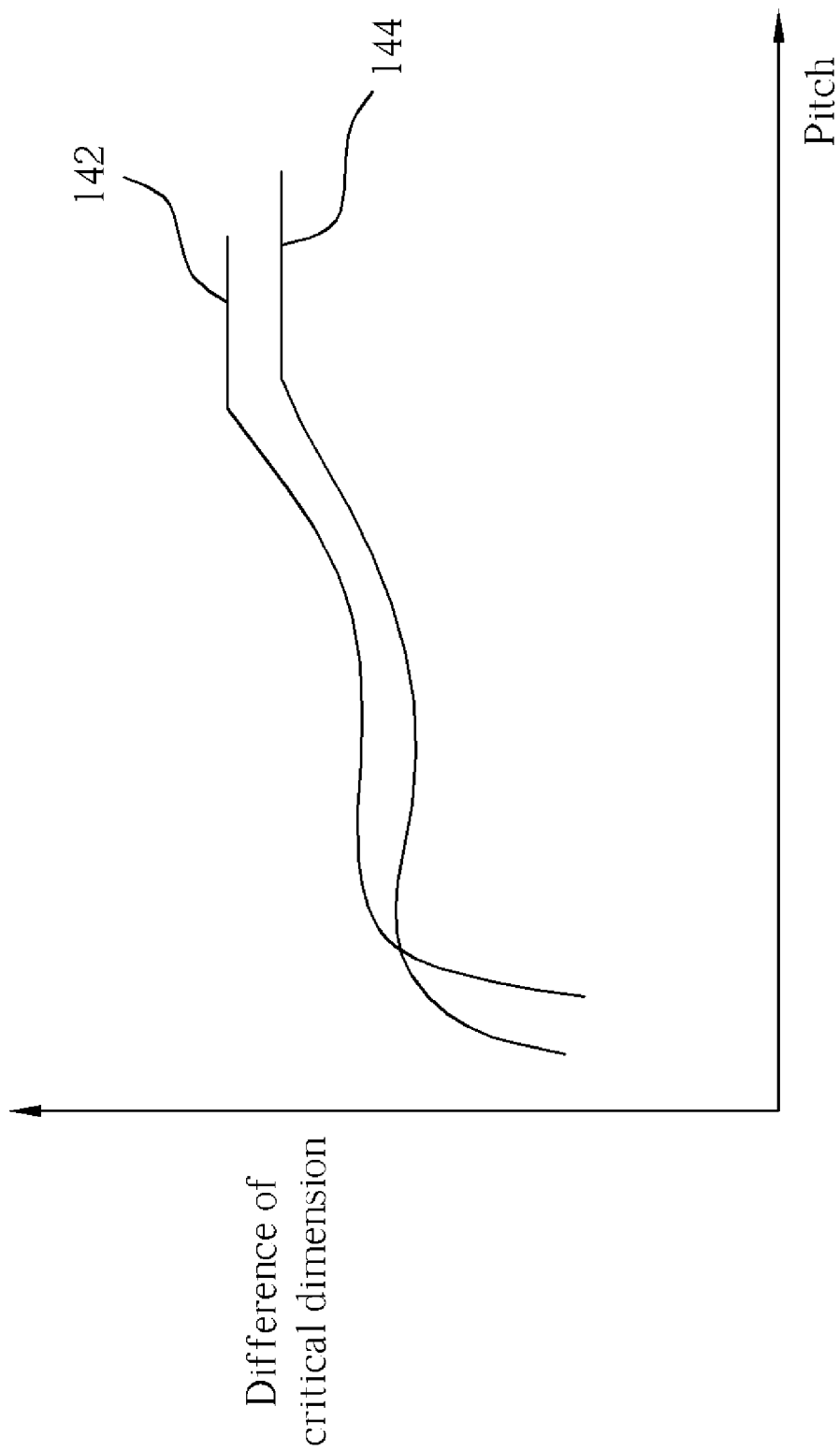
FIG. 5 shows a proximity profile error signature curve according to a difference of the proximity profile curves.
Figure 6:
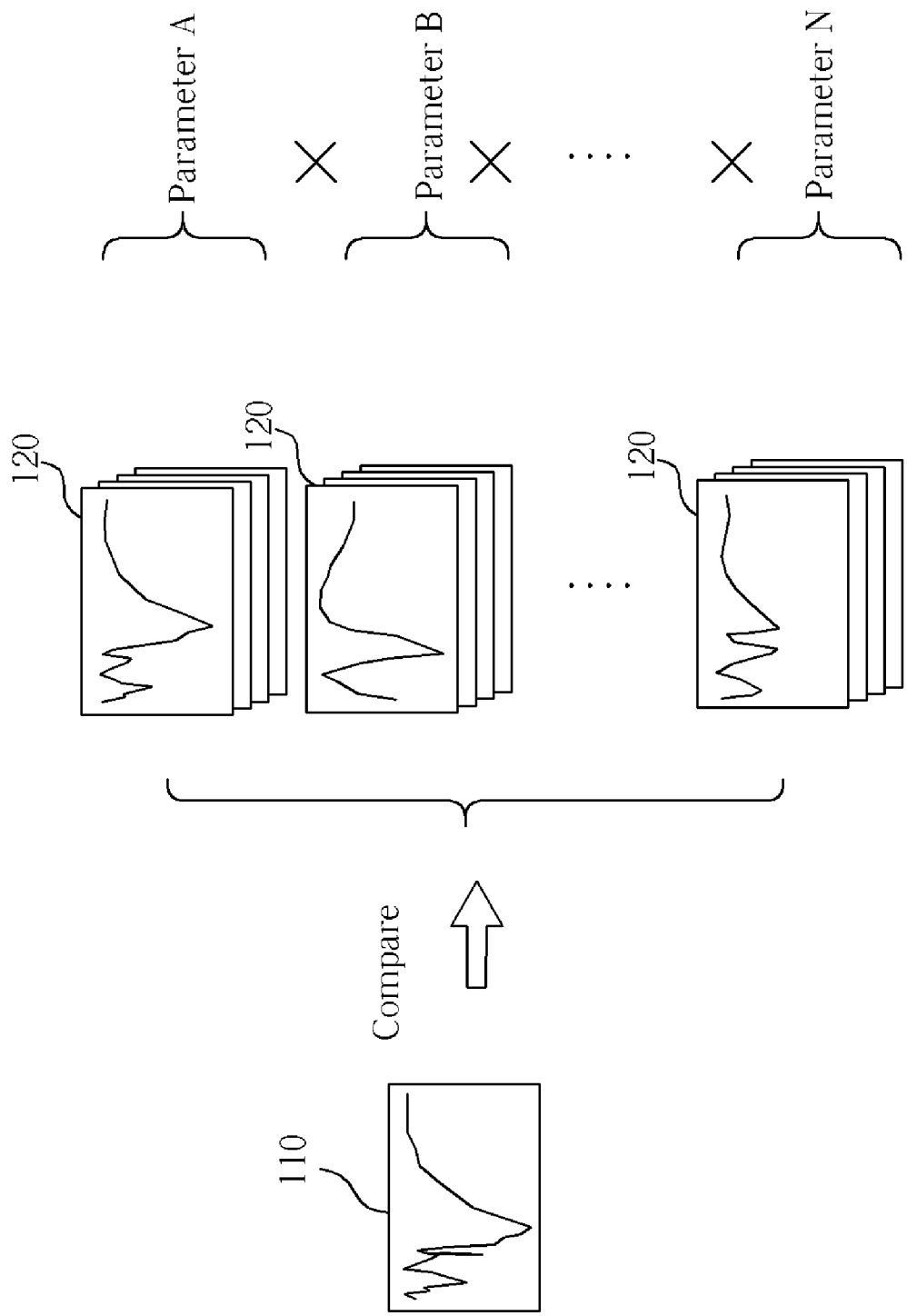
FIG. 6 shows how an under-test proximity profile error signature is compared with the proximity profile error signatures in the library.

In order to separately analyze the impacts from the manufacturing parameters in the photolithography process, a proximity profile error signature (PPES) is used to quantitatively classify these impacts in an embodiment of the present invention. PPES is defined as the difference between the baseline proximity profile and the shifted proximity profile. The proximity profile can be calculated from the measurement of the scatterometry CD metrology in FIG. 2. Please refer to FIG. 4. FIG. 4 shows a relationship between critical dimension and pitches when varying one of the process parameters. There are a baseline top CD proximity curve 134, a baseline bottom CD proximity curve 132, a shifted top CD proximity curve 138, and a shifted bottom CD proximity curve 136 in FIG. 4. Please refer to FIG. 5. The top PPES 144 is generated by calculating the difference between the baseline top CD proximity curve 134 and the shifted top CD proximity curve 138, and the bottom PPES is generated by calculating the difference between the baseline bottom CD proximity curve 132 and the shifted bottom CD proximity curve 136. Then, the respective PPES is generated according to each process parameter and a PPES library is established. Please refer to FIG. 6. When there is a manufacturing condition to be verified, the PPES 110 is generated and compared with the PPES 120 in the PPES library, and the parameters that make the process drift are found. In addition, the proximity profile can be represented by a formula with two variables. Therefore, the PPES can also be represented by the difference of the baseline formula and the shifted formula, and both are two-variable formulas. Please refer to FIG. 7, FIG. 8, and FIG. 9. The operating steps of the present invention are as follows:

Step 901: Start;

Step 902: Provide a photomask 500 with a plurality of pattern areas 560A-560I, wherein each of the pattern areas has a plurality test lines and pitches between the test lines of different pattern areas are different; Expose a wafer 31 via the photomask 500 to form a plurality of pattern areas 60A-60I with test lines of different pitches on the wafer 31;

Step 903: Measure the critical dimension of each of the pattern areas 60A-60I on the wafer 31 by scatterometry CD metrology and generate a proximity profile curve according to the relationship between the pitches of pattern areas 560A-560I and the critical dimension of the pattern areas 60A-60I;

Step 904: If the process parameters are changed, go to step 902, else continue to step 905;

Step 905: Generate a PPES library by calculating the difference of the baseline proximity profile and the shifted proximity profile of different process parameters;

Step 906: If there is a unknown manufacturing process to be verified, go to step 907, else continue to step 911;

Step 907: Expose a wafer 631 via the photomask 500 to form a plurality of pattern areas 660A-660I with test lines of different pitches on the wafer 631;

Step 908: Measure the critical dimension of each of the pattern areas 660A-660I on the wafer 631 by scatterometry CD metrology and generate a proximity profile curve according to the relationship between the pitches of pattern areas 560A-560I and the critical dimension of the pattern areas 660A-660I;

Step 909: Generate the PPES of the wafer 631 by calculating the difference of the baseline proximity profile and the shifted proximity profile;

Step 910: Compare the PPES of wafer 631 with the PPES library and determine the process parameters when exposing the wafer 631;

Step 911: End.

Figure 7:
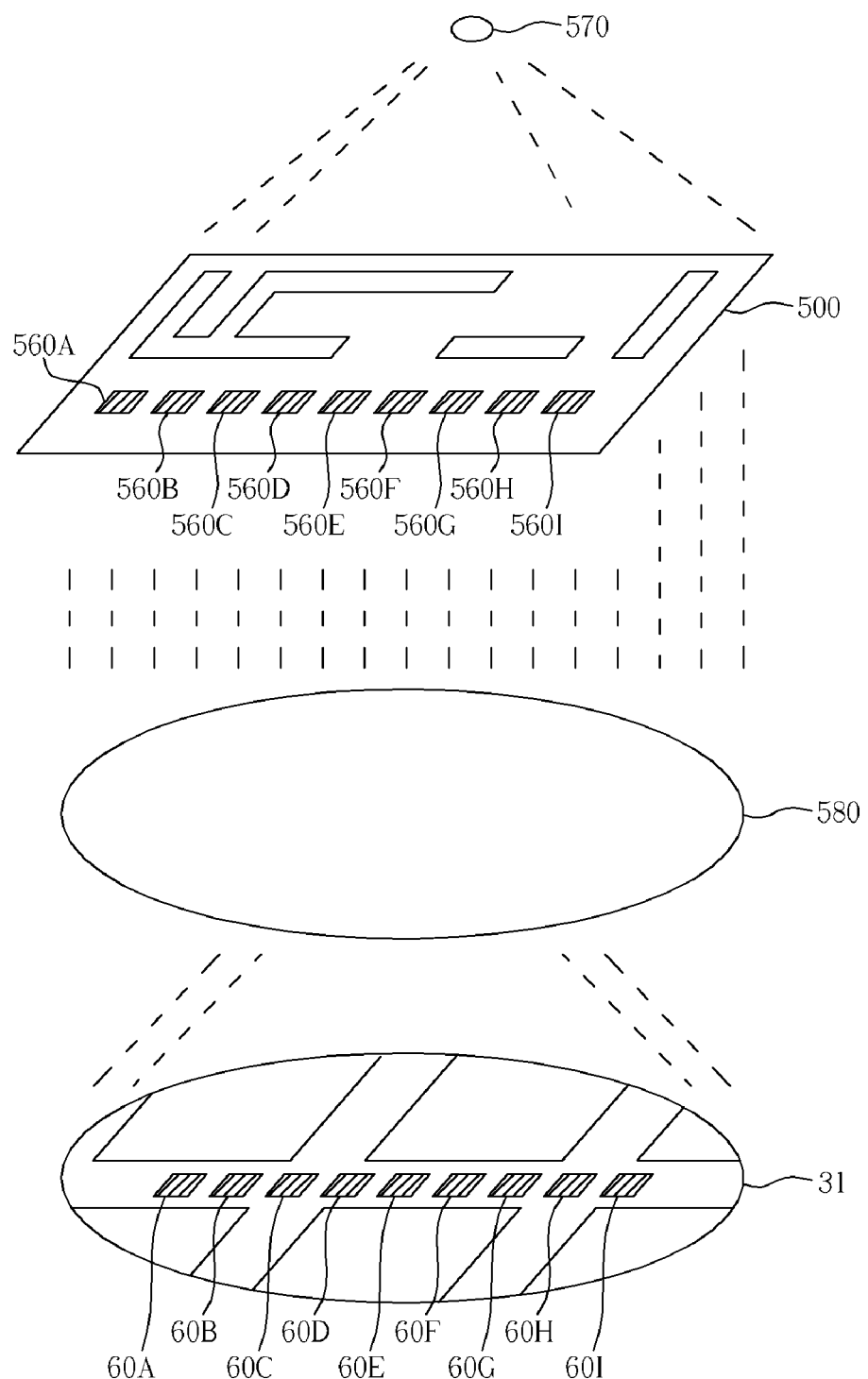
FIG. 7 shows a way a wafer is exposed.
Figure 8:
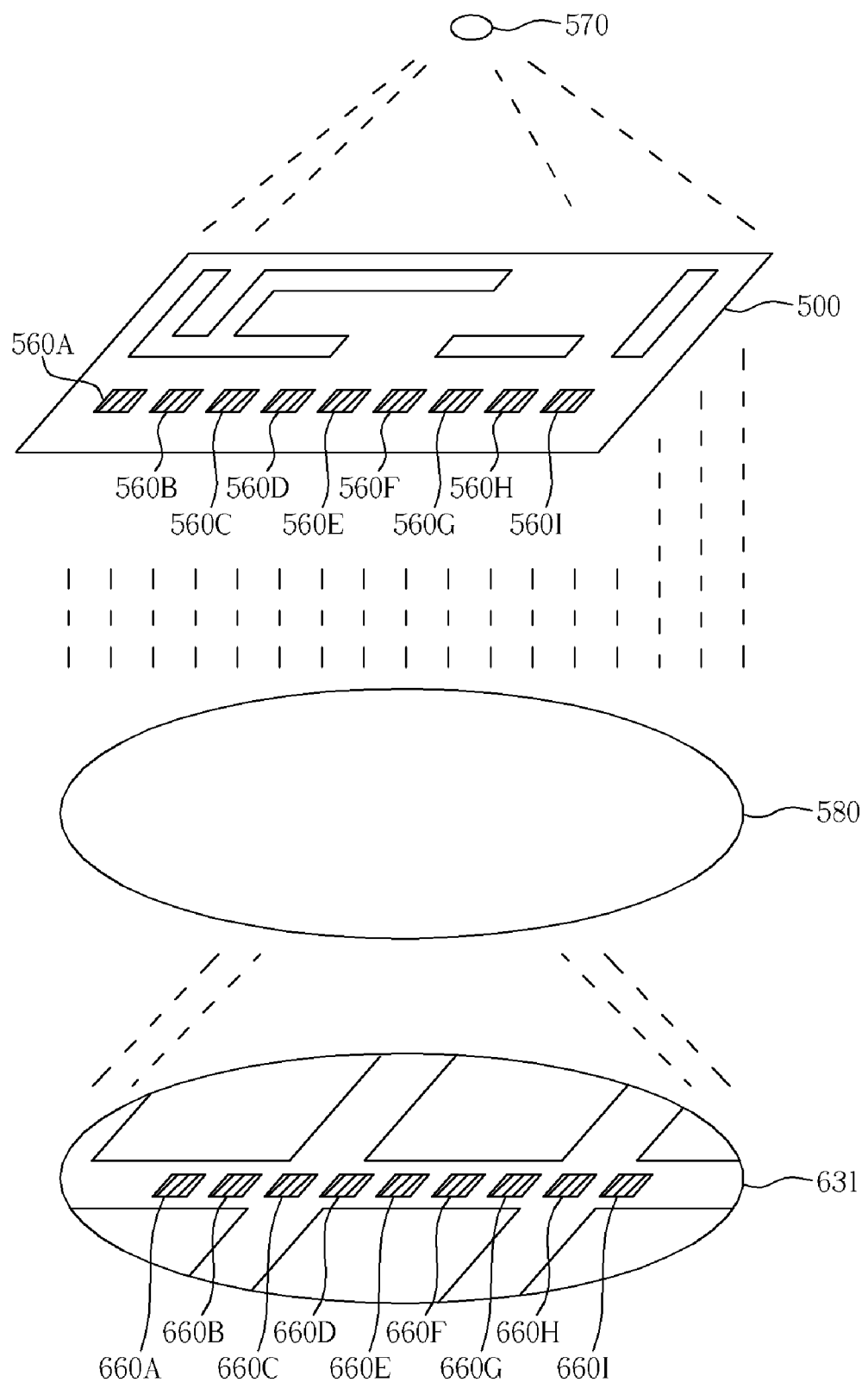
FIG. 8 shows a way an under-test wafer is exposed.
Figure 9:
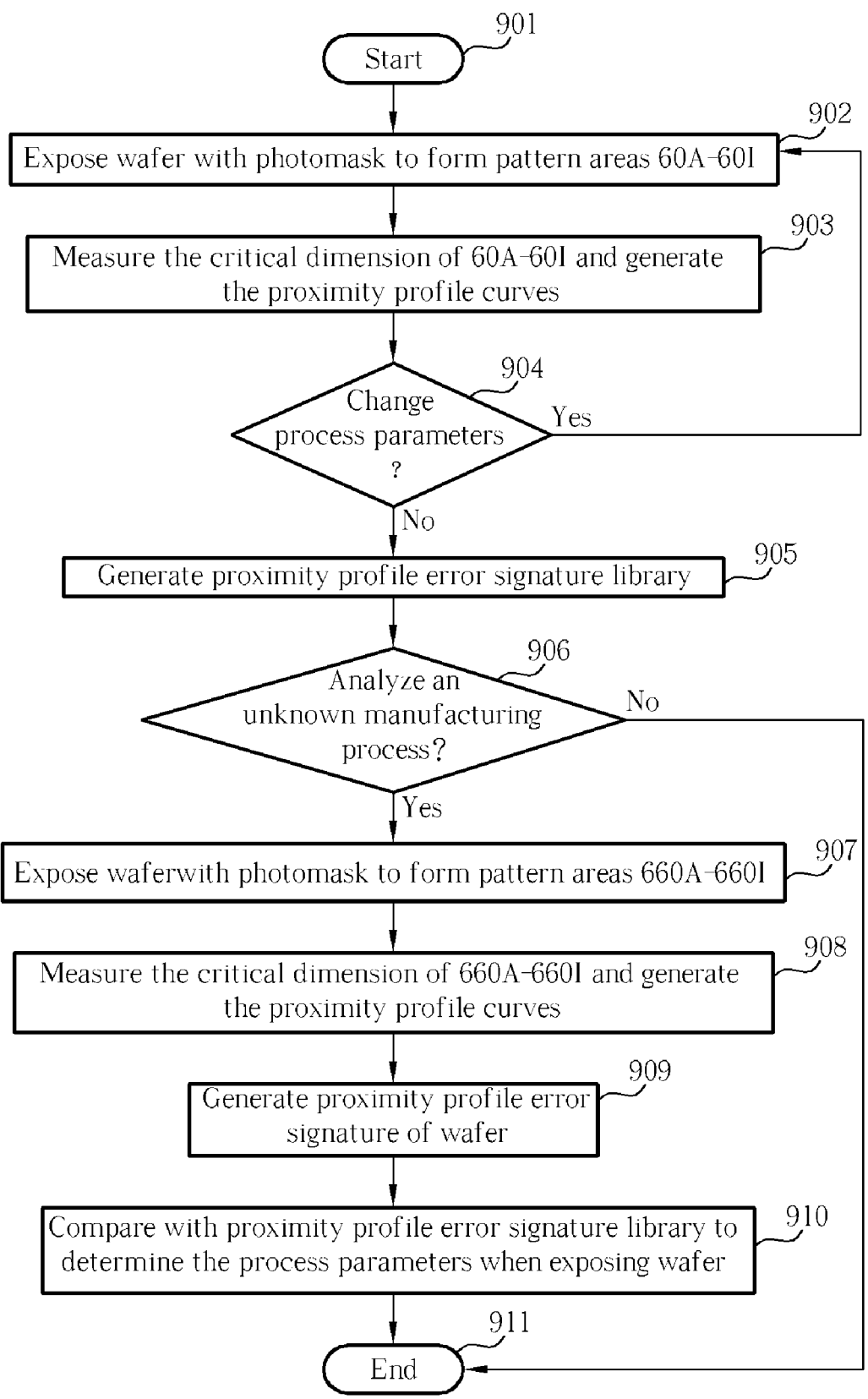
FIG. 9 is a flow chart describing how to detect process drift by using a proximity profile error signature.
Figure 10:
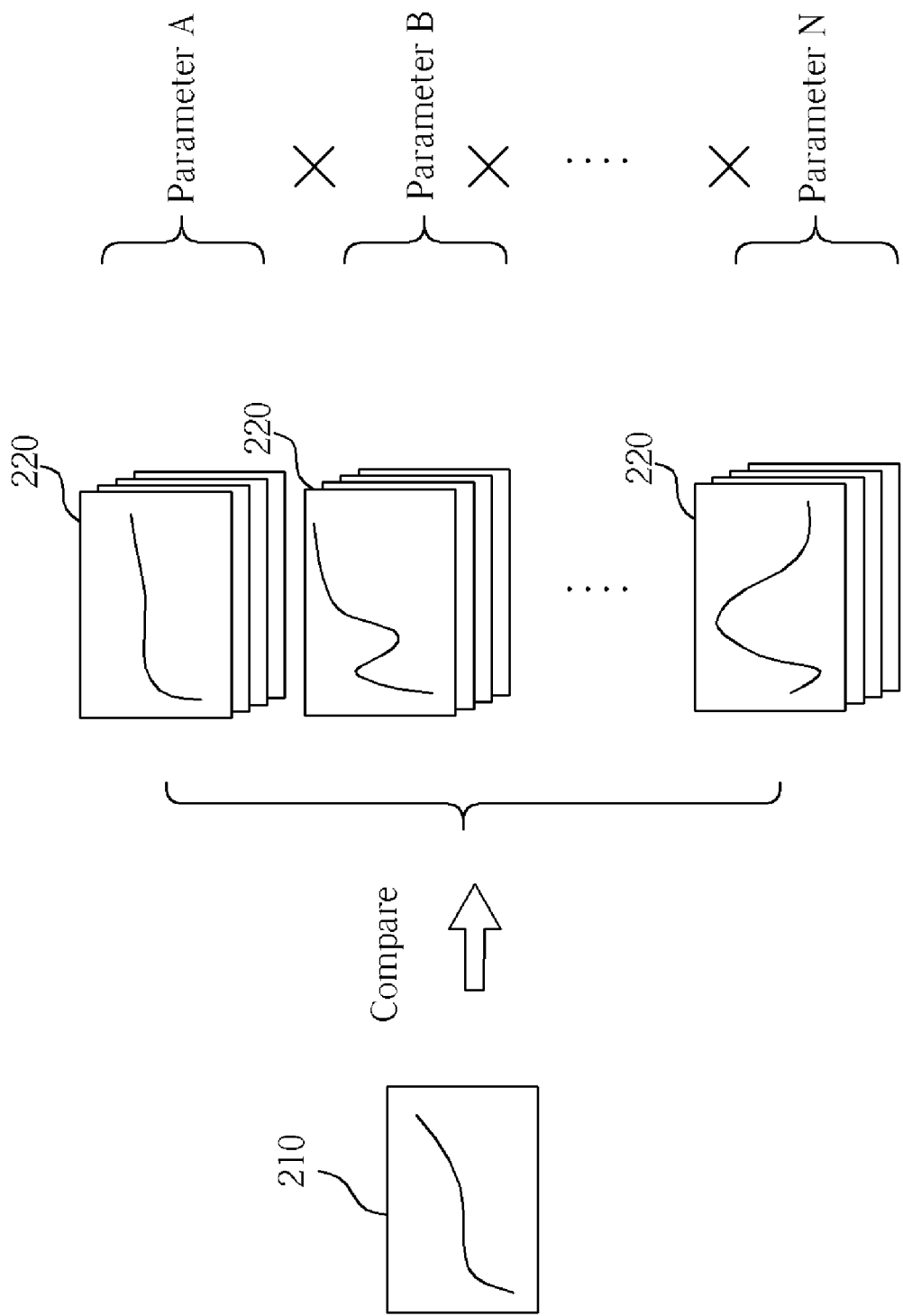
FIG. 10 shows a way an under-test spectra proximity error signature is compared with spectra proximity error signatures in the library.

In the embodiment of the present invention, the PPES library can be generated and saved in advance and is not necessarily generated repeatedly. Therefore it is also feasible for real-time analysis on the production line. The exposing processes in FIG. 7 and FIG. 8 are only illustrative. Actual exposing process may comprise exposing the wafers 31 and 631 with a plurality of photomasks and the exposing system 580 by using a light source 570 and generating the pattern areas on the wafers 31 and 631.

Figure 11:
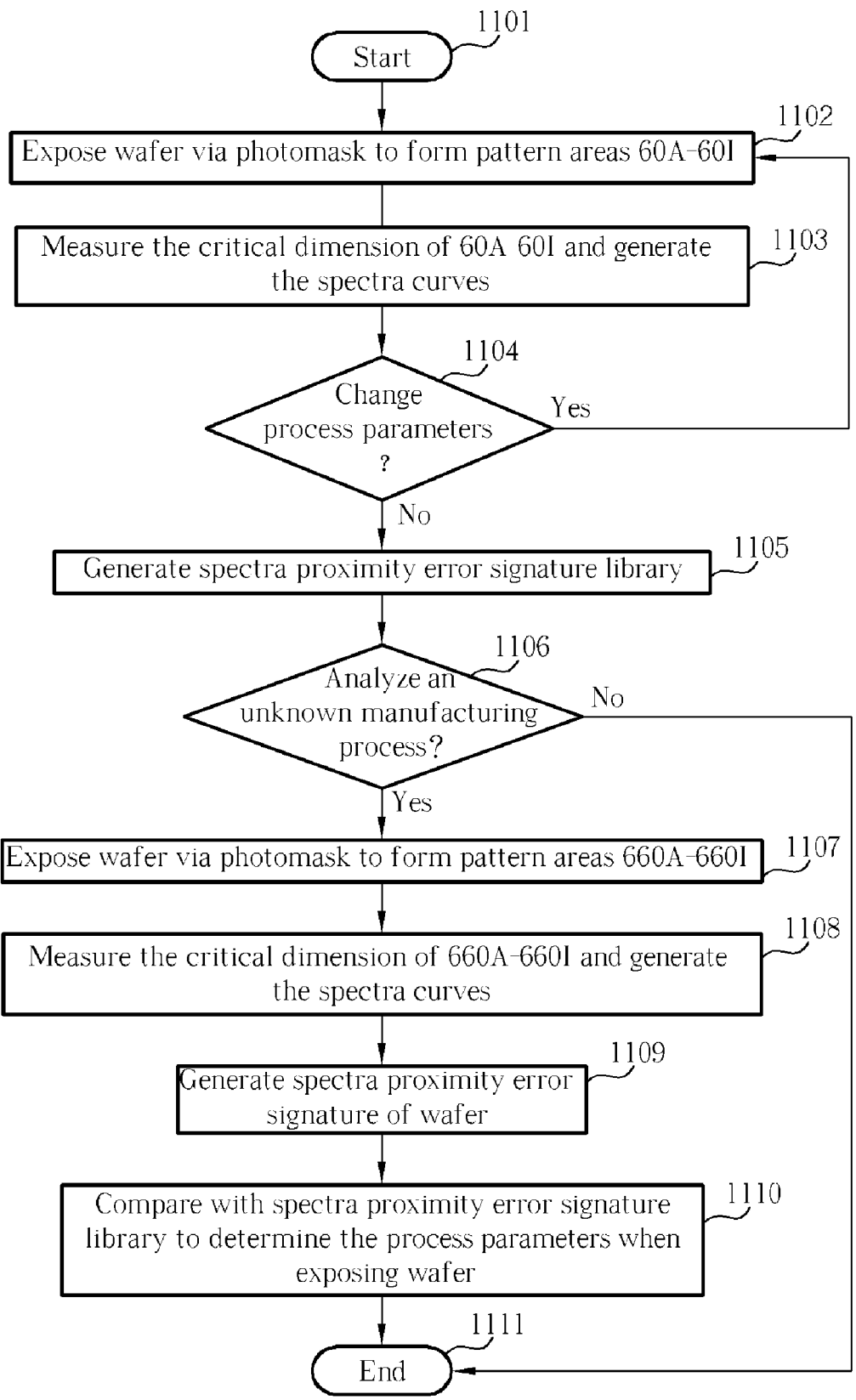
FIG. 11 is a flow chart describing how to detect process drift by using a spectra proximity error signature.

In other embodiments of the present invention, the spectra curve measured in the scatterometry CD metrology is used to quantitatively classify these impacts. A spectra proximity error signature (SPES) is defined as the difference between the baseline spectra and the shifted spectra. The spectra can be measured in the scatterometry CD metrology in FIG. 2. The respective SPES is generated according to each process parameter and a SPES library is established. When there is a manufacturing condition to be verified, the SPES 210 is generated and compared with the SPES 220 in the PPES library, and the parameters that make the process drift are determined. Please refer to FIG. 7, FIG. 8, and FIG. 11. The operating steps of the present invention are as follows:

Step 1101: Start;

Step 1102: Provide a photomask 500 with a plurality of pattern areas 560A-560I, wherein each of the pattern areas has a plurality test lines and pitches between the test lines of different pattern areas are different; Expose a wafer 31 via the photomask 500 to form a plurality of pattern areas 60A-60I with test lines of different pitches on the wafer 31;

Step 1103: Measure the critical dimension of each of the pattern areas 60A-60I on the wafer 31 by scatterometry CD metrology and generate a spectra curve according to the relationship between the pitches of pattern areas 560A-560I and the critical dimension of the pattern areas 60A-60I;

Step 1104: If the process parameters are changed, go to step 1102, else continue to step 1105;

Step 1105: Generate a SPES library by calculating the difference of the baseline spectra and the shifted spectra of different process parameters;

Step 1106: If there is a unknown manufacturing process to be verified, go to step 1107, else continue to step 1111;

Step 1107: Expose a wafer 631 via the photomask 500 to form a plurality of pattern areas 660A-660I with test lines of different pitches on the wafer 631;

Step 1108: Measure the critical dimension of each of the pattern areas 660A-660I on the wafer 631 by scatterometry CD metrology and generate a spectra curve according to the relationship between the pitches of pattern areas 560A-560I and the critical dimension of the pattern areas 660A-660I;

Step 1109: Generate the SPES of the wafer 631 by calculating the difference of the baseline spectra and the shifted spectra;

Step 1110: Compare the SPES of wafer 631 with the SPES library and determine the process parameters when exposing the wafer 631;

Step 1111: End.

In the embodiment of the present invention, the SPES library can be generated and saved in advance and is not necessarily generated repeatedly. Therefore, it is also feasible for real-time analysis on the production line. In addition, in this embodiment the comparisons are based on the directly measured spectra data, alleviating the need to convert the spectra data to the profile data.

The present invention analyzes the respective impact of these photolithographic process parameters on the proximity behavior and detects drift in semiconductor process parameters. By providing both the profile analysis and spectra analysis methods, these methods are feasible for more critical dimension measurement metrologies.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for detecting a condition for manufacturing a semiconductor wafer, the method comprising:
    (a) providing a photomask having a plurality of pattern areas, each of the pattern areas having a plurality test lines, pitches between the test lines of different pattern areas being different;
    (b) exposing a plurality of wafers via the photomask with different sets of process parameters so as to form pattern areas with test lines of different pitches on each of the wafers;
    (c) measuring a critical dimension of each of the pattern areas of each of the wafers;
    (d) establishing a relationship between the pitches of the pattern areas of each of the wafers and the measured critical dimensions of the pattern areas of the wafer;
    (e) exposing a wafer via the photomask so as to form pattern areas with test lines of different pitches on the wafer;
    (f) measuring a critical dimension of each of the pattern areas of the wafer in step (e);
    (g) establishing a relationship between the pitches of the pattern areas of the wafer in step (e) and the measured critical dimensions of the pattern areas of the wafer in step (e);
    (h) finding a relationship from the relationships established in step (d) which is most similar to the relationship established in step (g); and
    (i) detecting a set of process parameters used to expose the wafer in step (e) according to the relationship found in step (h).

2. The method of claim 1 further comprising:
    (j) establishing a quadratic equation corresponding to the pitches and the critical dimensions of each of the wafers according to the relationships established in step (d).

3. The method of claim 2 wherein step (h) comprises finding a quadratic equation from the quadratic equations established in step (j) which is a best match to the relationship established in step (g).

4. The method of claim 2 further comprising:
    (k) establishing a quadratic equation of the pitches and the critical dimensions of the wafer in step (e) according to the relationship established in step (g).

5. The method of claim 4 wherein step (h) comprises finding a quadratic equation from the quadratic equations established in step (j) which is a best match to the quadratic equation established in step (k).

6. The method of claim 4 further comprising:
    (l) generating a proximity profile error signature (PPES) curve of each of the wafers in step (b) according to a difference between the quadratic equation of the wafer established in step (j) and a standard quadratic equation;
    (m) generating a PPES curve of the wafer in step (e) according to a difference between the quadratic equation of the wafer established in step (k) and a standard quadratic equation; and
    (n) finding a PPES curve from the PPES curves generated in step (l) which is a best match to the PPES curve generated in step (m).

7. The method of claim 1 wherein step (c) comprises measuring a critical dimension from a top of protruded structures of each pattern area of each of the wafers in step (b), and step (f) comprises measuring a critical dimension from a top of protruded structures of each pattern area of the wafer in step (e).

8. The method of claim 1 wherein step (c) comprises measuring a critical dimension from a bottom of protruded structures of each pattern area of each of the wafers in step (b), and step (f) comprises measuring a critical dimension from a bottom of protruded structures of each pattern area of the wafer in step (e).

9. The method of claim 1 wherein step (c) comprises measuring a critical dimension from a top and a bottom of protruded structures of each pattern area of each of the wafers in step (b), and step (f) comprises measuring a critical dimension from a top and a bottom of protruded structures of each pattern area of the wafer in step (e).

10. The method of claim 1 further comprising:
(o) adjusting the set of process parameters according to the set of process parameters detected in step (i) and a standard set of process parameters.

11. The method of claim 1 further comprising:
(p) exposing a wafer via the photomask according to the set of process parameters adjusted in step (o).

12. The method of claim 1 wherein step (c) comprises measuring the critical dimension of each of the pattern areas of each of the wafers in step (b) by using a scatterometry critical dimension metrology.

13. The method of claim 1 wherein step (f) comprises measuring the critical dimension of each of the pattern areas of the wafer in step (e) by using a scatterometry critical dimension metrology.

14. A method for detecting a condition for manufacturing a semiconductor wafer, the method comprising:
(a) providing a photomask having a plurality of pattern areas, each of the pattern areas having a plurality test lines, pitches between the test lines of different pattern areas being different;
(b) exposing a plurality of wafers via the photomask with different sets of process parameters so as to form pattern areas with test lines of different pitches on each of the wafers;
(c) measuring the pattern areas of each of the wafers and generating a set of spectrums of the pattern areas of the wafer accordingly;
(d) exposing a wafer via the photomask so as to form pattern areas with test lines of different pitches on the wafer;
(e) measuring the pattern areas of the wafer in step (d) and generating a set of spectrums of the pattern areas of the wafer accordingly;
(f) finding a set of spectrums from the sets of spectrums generated in step (c) which is most similar to the set of spectrums generated in step (e); and
(g) detecting a set of process parameters used to expose the wafer in step (d) according to the set of spectrums found in step (f).

15. The method of claim 14 further comprising:
(h) adjusting the set of process parameters according to the set of process parameters detected in step (g) and a standard set of process parameters.

16. The method of claim 15 further comprising:
(i) exposing a wafer via the photomask according to the set of process parameters adjusted in step (h).

17. The method of claim 14 wherein step (c) comprises measuring the pattern areas of each of the wafers in step (b) by using a scatterometry critical dimension metrology and generating the set of spectrums of the pattern areas of the wafer accordingly.

18. The method of claim 14 wherein step (e) comprises measuring the pattern areas of the wafer in step (d) by using a scatterometry critical dimension metrology and generating the set of spectrums of the pattern areas of the wafer accordingly.

* * * * *